United States Patent [19]
Rydin

[11] Patent Number: 5,198,658
[45] Date of Patent: Mar. 30, 1993

[54] TRANSIMPEDANCE AMPLIFIER-INPUT STAGE FOR AN OPTICAL RECEIVER

[75] Inventor: Arne Rydin, Snörpvadsgatan, Sweden

[73] Assignee: Telefonaktiebolaget L M Ericsson, Stockholm, Sweden

[21] Appl. No.: 733,178

[22] Filed: Jul. 19, 1991

[30] Foreign Application Priority Data

Jul. 19, 1990 [SE] Sweden ................. 9002469

[51] Int. Cl.$^5$ .................. H01J 40/14; H03F 17/00
[52] U.S. Cl. ............................ 250/214 A; 330/59
[58] Field of Search .............. 250/214 R, 214 A, 551; 359/189, 194; 330/59, 308; 356/218, 226; 307/311, 271

[56] References Cited

U.S. PATENT DOCUMENTS 5,008,524  4/1991  Reutter et al. ............... 250/214 A
5,023,951  6/1991  Kahn .............................. 330/59

FOREIGN PATENT DOCUMENTS 0130180  10/1980  Japan ................. 307/311
0245725   9/1989  Japan ................. 359/189
0305042  12/1990  Japan ................. 359/189

Primary Examiner—David C. Nelms
Assistant Examiner—Hoa Q. Pham
Attorney, Agent, or Firm—Burns, Doane, Swecker & Mathis

[57] ABSTRACT

An input stage for an optical receiver with a photodiode (T), which has its output connected, via a capacitor ($C_1$), to the input of a transimpedance amplifier (f), includes a unit having a resistance depending on the voltage, which is connected between the output of the photodiode and the earth potential of the amplifier. The photodiode is a PIN diode, and said unit with a voltage dependent resistance includes a feed-back amplifier (Df) with a frequency response adapted to that of the transimpedance amplifier.

8 Claims, 3 Drawing Sheets

TRANSIMPEDANCE AMPLIFIER-INPUT STAGE FOR AN OPTICAL RECEIVER

TECHNICAL FIELD

The present invention relates to an input stage for an optical receiver, with a photodiode which has its output connected, via a capacitor, to the input of a transimpedance amplifier, a unit having a resistance dependent on the voltage being connected between the output of the photodiode and the earth potential of the amplifier.

PRIOR ART

Most devices for converting optical energy to electrical energy have a high impedance, in the megohm range. This makes great demands on the following amplifier, since high sensitivity, low noise and large dynamic range are generally aimed at.

The greatest sensitivity is usually obtained when matching the impedance between amplifier and converter. In high-sensitivity systems the input stage is accordingly most often some type of field effect transistor, preferably one of the MESFET type. A typical circuit is illustrated in FIG. 1. The bias resistor RB must be as large as possible for the noise to be as low as possible, the order of 100 kohm to several Mohm. This high value of the bias resistor results in a rapid overamplification of the amplifier, however.

EXAMPLE 1

The typical responsiveness of PIN diode converters is 1 A/W for 1550 nm, which gives for RB=1 Mohm an input voltage of 2 V to the transistor already for 2 uW optical power ('27 dBm).

The dynamic range can be improved somewhat if dynamic gain control is introduced.

The problem with amplifiers having high impedance is further complicated by shunt capacitance (Cshunt) of the input node. This is comprised partly of the converter capacitance, partly of the amplifier input capacitance and partly of stray capacitances. A typical value of the total input node shunt capacitance Cshunt is 1 pF. Together with the bias resistor RB this determines the upper limiting frequency.

EXAMPLE 2

RB=1 Mohm in parallell with Cshunt=1 pF gives the upper limiting frequency of 159 kHz.

For most practical applications a large frequency correction must consequently be introduced.

When absolutely highest sensitivity is not required, a current voltage converter, i.e. a transimpedance amplifier, is used. A typical device is illustrated in FIG. 2. The amplifier input impedance is low, approximately RFB/A(jw), where A(jw) is the raw gain of the amplifier. The output voltage $u_{out}$ of the latter will be $RFB*i_{in}$, where $i_{in}$ is the input current. Typical values of RFB are 2 to 30 kohm. The low impedance will shunt the capacitance in the input node with a higher upper limiting frequency resulting. Transimpedance amplifiers accordingly more often provide a higher dynamic range than amplifiers having high input impedance. Dominating noise sources are the current noise in RFB and the noise in the input transistor Q1. From the noise aspect, RFB should therefore be made as large as possible. A large value of RFB, however, the upper limiting frequency and deteriorates the capacity of the amplifier to amplify strong signals without distortion.

In order to keep down the total cost of an electronic system, it is most often desirable to keep the number of feed voltages down, and there is a clear tendency to use only one, e.g. +5 V or −5 V. This reduces the dynamic range, however.

EXAMPLE 3

With an amplifier according to FIG. 2, together with a PIN diode obtains a typical sensitivity of −37 dBm for 1550 nm wavelength, RFB=10 kohm and a bit rate of 155 Mb/s. The greatest possible output voltage deviation is about 700 mV (=the base emitter voltage of the transistor Q1). After this the transistor becomes saturated, with resulting strong distortion. This gives a maximum input signal level of about 70 mV optical power, i.e. a mean power of −14.5 dBm. Typical dynamic range will thus be some dB above 20 dB.

In a communication system using optical fibres, the transmitted mean optical power is on the order of magnitude of −3 dBm. This means that careful attention must be paid to the length of the optical connection, and some form of attenuation must be provided for short connections. This increases the cost of the installation. An increased dynamic range is consequently of great interest.

An obvious method of increasing the dynamic range is to connect the converter to the amplifier with the aid of a capacitor, thus enabling positive and negative deviations at the amplifier output in relation to the rest state. An improvement of 3 dB can thus be obtained. When the optical signal is unipolar, i.e. it has a DC content, there must be a path for the direct current. The converter may then be connected according to FIG. 3. The resistor $R_{leak}$ should not be greater than 10-15 kOhm, thus, preventing an undesirable voltage drop due to the direct current. This means in its turn that the resistor contributes to increased current noise, which reduces the sensitivity and causes the increase of the dynamic range to be merely marginal.

To keep maintenance costs down it is desirable to have operational supervision. If the system can continuously supervise the received optical power, service can be carried out before the system fails completely. The supervision must, however, be performed without deterioration of the rest of the system performance, and with adequate accuracy.

The DC content of the input signal can be used to enable capacitor coupling for gain control and to generate a signal proportional to incoming optical power without otherwise notably altering other properties. Connection of the converter T in series with an element D having voltage dependent resistance, see FIG. 4, a differential resistance of the element will use the DC component of the input signal in such a manner decreasing with the direct current passing through the element. In its simplest form the element D comprises a semiconductor diode or a diode-coupled transistor. The combination of the converter T and the element D is connected via a capacitor C to the input of the amplifier F for capacitor coupling creating gain control and proportional signal generation relative to incoming optical power.

The function is as follows:

The direct current of the input signal charges the capacitor C simultanously as the element D begins to conduct. A state of equilibrium is arrived, when C is charged and all direct current flows through D. When a light pulse reaches the converter a current pulse passes through it, the capacitor C is charged a little in relation to the state of equilibrium, and a current flows into the amplifier, the output of which goes negative. When the light pulse ceases, the capacitor is discharged through D, a current flowing out of the amplifier, the output of which goes positive. During the whole process, a current will flow though D, the differential resistance of which decreases, and shunts a part of the input signal. For small input signals close to the sensitivity limit the DC content of the input signal is small, and therefore the current through D is insignificant and the noise increment from D is practically negligible. The noise increment from D does indeed increase for large input signals, but since the input signal level has increased at the same time the signal-noise ratio will increase with an increased input signal.

The dynamic range is increased in the range of 3 dB (power) as a result of the capacitor coupling in the arrangement described above. In addition, there will be attenuation of large input signals as they are shunted as a result of the decreasing dynamic resistance of D. This attenuation of large input signals as they are shunted is a result of the decreasing dynamic resistance, of D. This attenuation gives a further improvement in the dynamic range. With the aid of the described circuit, input signals in the range of eight times as large can be coped handled as compared to other conventional circuits, while at the same time sensitivity is insignificantly effected.

SUMMARY OF THE INVENTION

The object of the present invention is to provide an input stage where the DC content of the input signal is utilised to enable capacitor coupling for gain control and to generate a signal proportional to the incoming optical power without noticeably altering remaining properties as discussed above, while the upper limiting frequency of the stage is constant or increases with increasing input signals, this object is achieved by a stage of the kind stated in the introduction with the following characterising features an input stage for an optical receiver comprised of a PIN photodiode, a transimpedance amplifier, an output of the PIN photodiode being connected via capacitor, to an input of the transimpedance amplifier, and a unit having a resistance dependent on a voltage connected between the output of the PIN photodiode and an earth potential of the transimpedance amplifier. The unit includes a feed-back amplifier with a frequency response adapted to a frequency response of the transimpedance amplifier.

According to one advantageous embodiment of the stage in accordance with the invention, a further current mirror coupled transistor is connected to the feed-back amplifier, whereby continuous supervision of received optical power can be provided in an advantageous manner.

According to another advantageous embodiment of the input stage, according to the invention a regulated amplifier is connected to the transimpedance amplifier output, the control signal of the regulated amplifier being used for creating an extra control current which is returned to the input of the amplifier to increase attenuation of the input signal for large input signal levels.

DESCRIPTION OF FIGURES

Embodiments of the input stage in accordance with the invention, selected as examples, will now be described in more detail with reference to FIGS. 5-7. On the drawings

PREFERRED EMBODIMENTS

Figure 1:
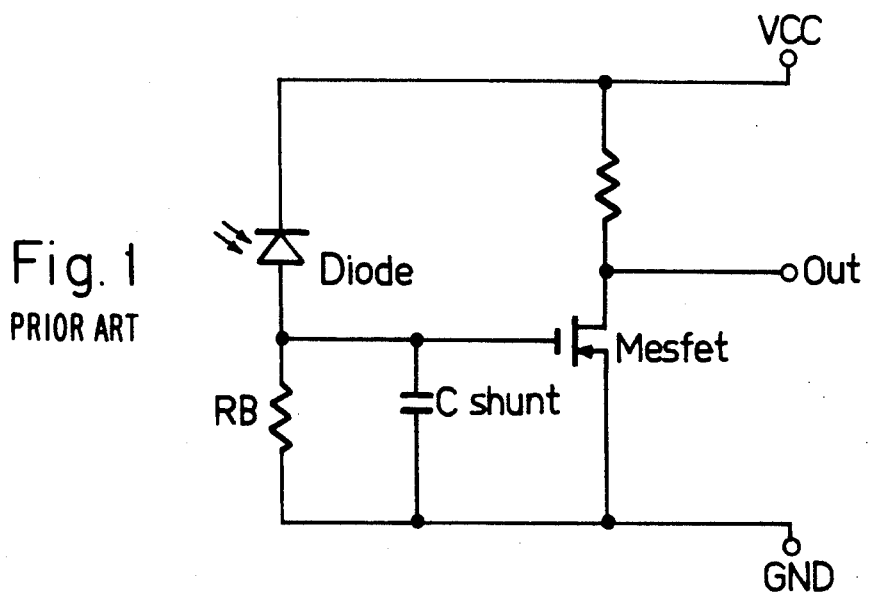
FIGS. 1-4 illustrate different embodiments according to prior art.
Figure 2:
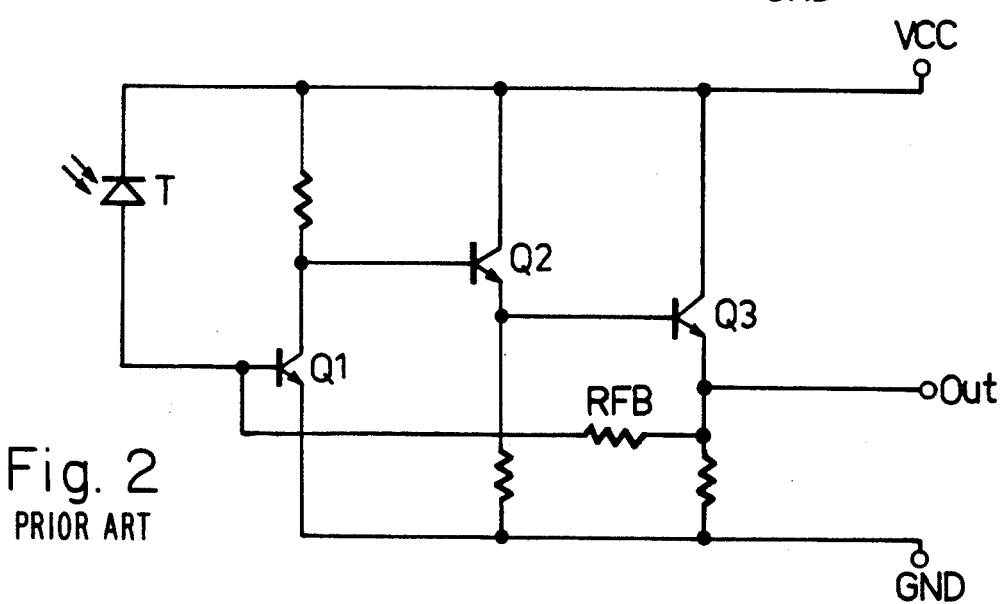
Figure 3:
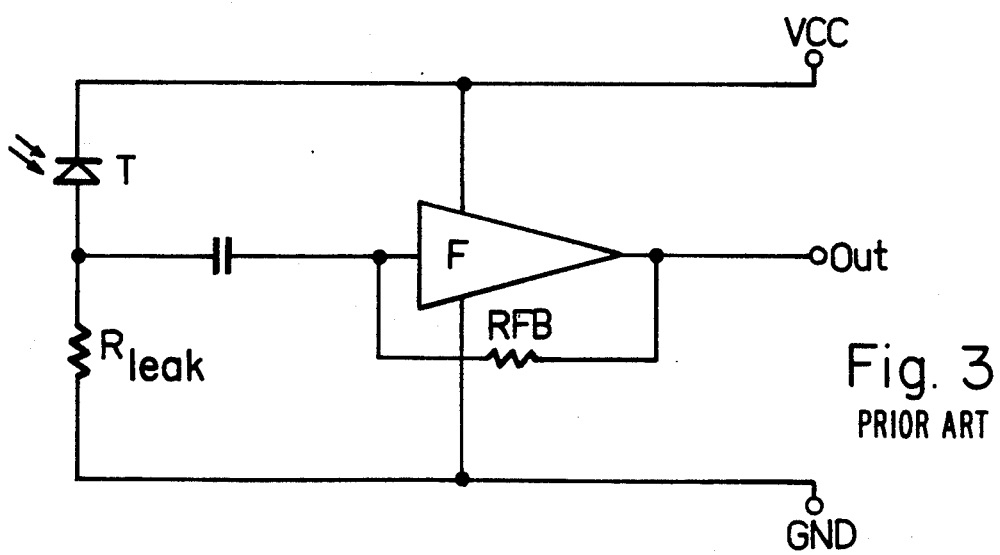
Figure 4:
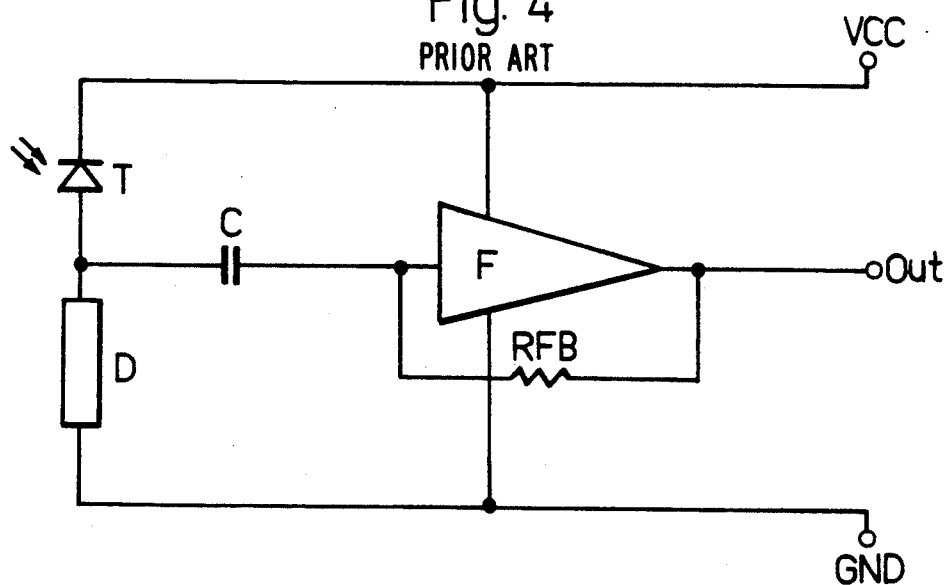
Figure 5:
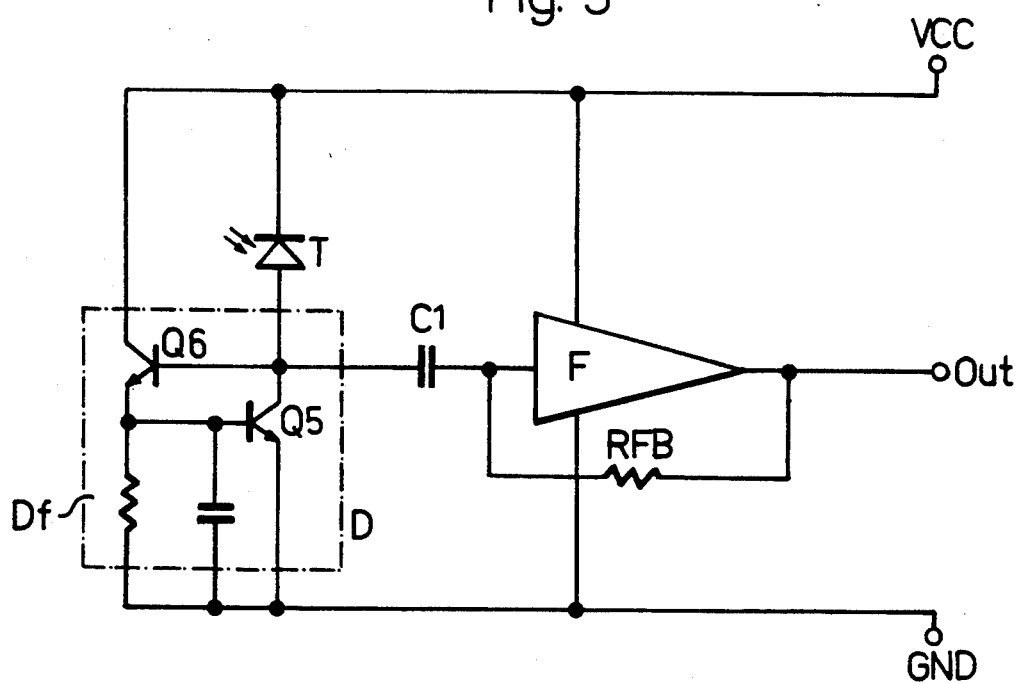
FIG. 5 illustrates a first embodiment of the input stage according to the invention with a feed-back amplifier in series with the optoelectric converter.
Figure 6:
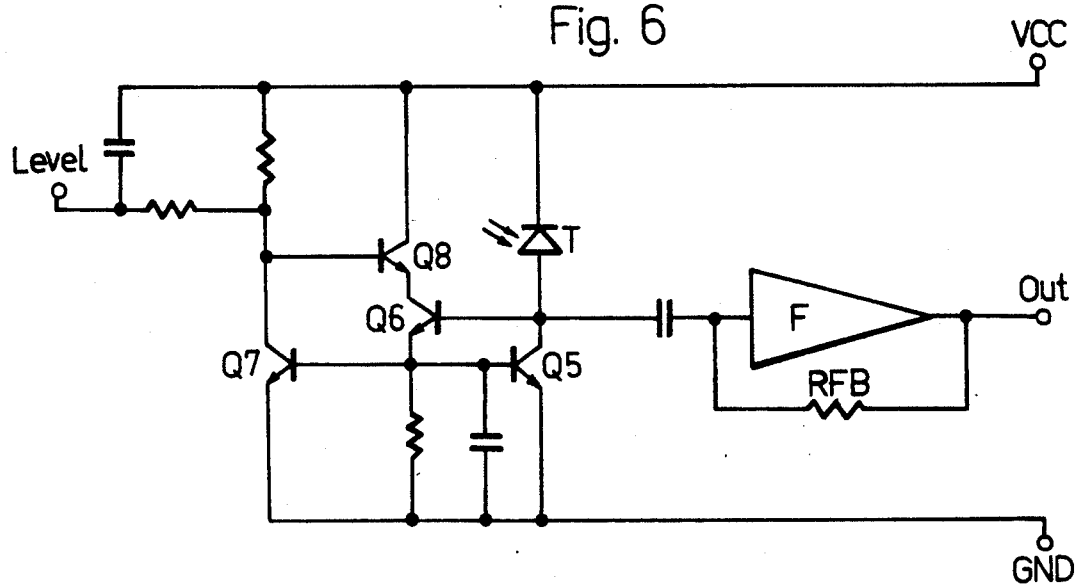
FIG. 6 illustrates an embodiment with a current mirror coupling, and FIG. 7 an embodiment with a regulated amplifier after the transimpedance amplifier.

In FIG. 5 there is illustrated an embodiment of the inventive input stage according to the invention where the unit having voltage dependent resistance comprises a feed-back amplifier (DF). This implementation gives important advantages. By modifying the frequency response of the amplifier Df, frequency respo it can be better adapted to amplifier F than has previously been possible maintaining the upper limiting frequency of the complete device at a constant for an increasing input signal, or allowing an increase of the upper limiting frequency for an increasing input signal are desirable results of the preferred embodiment. In FIG. 6 there is illustrated a further embodiment having a transistor Q7 in current mirror coupling. In this case the current flowing through the transistor will be substantially equal to the current through the amplifier Df. After filtering, this current will be directly proportional to the direct current through the converter T and thus proportional to the optical input power, and can therefore be used for surveying the system. Direct information about the signal intensity is accordingly obtained. The transistor Q8 then compensates for the base current of the transistor Q6.

Figure 7:
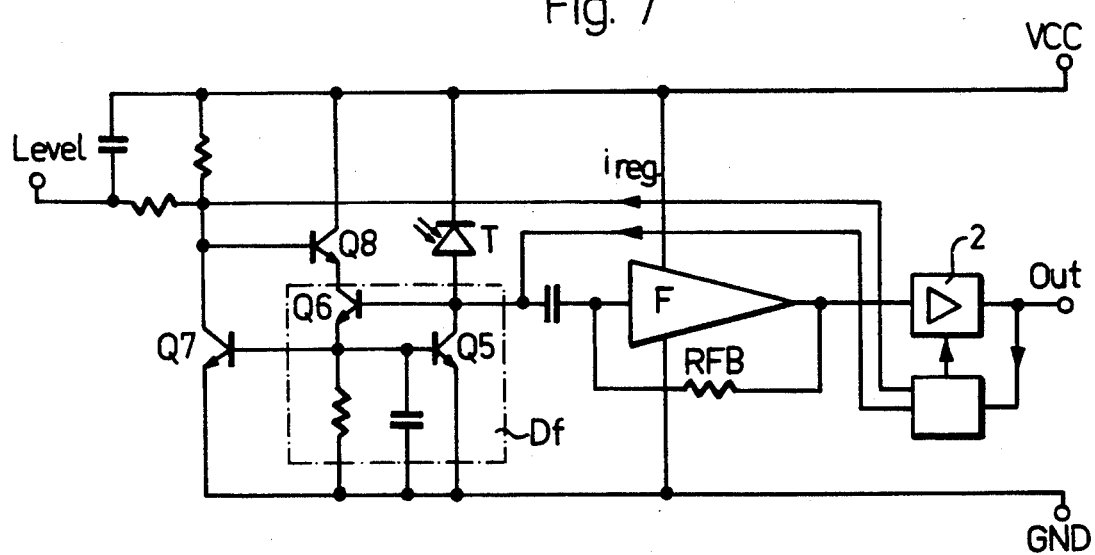

In a complete receiver, the transimpedance amplifier F is most often followed either by a limiting amplifier, or an amplifier provided with gain control. As illustrated in FIG. 7, the regulating signal from the regulated amplifier (2) can be used to create an extra regulating current ($i_{reg}$), for high input signal levels. Regulating current $i_{reg}$ is fed back into the input of amplifier Df for further reducing its resistance, with increased attenuation of the input signal as a result, see FIG. 7.

I claim:

1. An input stage for an optical receiver comprising:
    a PIN photodiode;
    a transimpedance amplifier, an output of said PIN photodiode being connected via a capacitor, to an input of said transimpedance amplifier; and
    a unit having a resistance dependent on a voltage connected between said output of said PIN photodiode and an earth potential of said transimpedance amplifier, said unit including a feed-back amplifier with a frequency response adapted to a frequency response of said transimpedance amplifier.

2. The input stage as claimed in claim 1, wherein the frequency response of the feed-back amplifier is adapted to that of the transimpedance amplifier such that an upper limiting frequency of the stage is constant independent of the signal from the photodiode.

3. The input stage as claimed in claim 1, wherein the frequency response of the feed-back amplifier is adapted to that of the transimpedance amplifier such that the upper limiting frequency of the stage increases for an increasing signal form the photodiode.

4. The input stage as claimed in claim 1, further comprising a transistor connected in a current mirror coupling arrangement to the feed-back amplifier.

5. The input stage as claimed in claim 4, further comprising a compensating transistor disposed to compensate for a base current of a transistor of the feed-back amplifier.

6. The input stage as claimed in claim 1, further comprising a limiting amplifier connected to the output of the transimpedance amplifier.

7. The input stage as claimed claim 1, further comprising a regulated amplifier connected to the output of the transimpedance amplifier.

8. The input stage as claimed in claim 7, wherein for high input signal levels from the photodiode the regulated amplifier is adapted to generate an extra control current to be returned to the input of the feed-back amplifier for further lowering its resistance and thereby increasing attenuation of the input signal.

* * * * *